(12) United States Patent
Chang et al.

(10) Patent No.: US 8,270,499 B2
(45) Date of Patent: Sep. 18, 2012

(54) RECEIVER WITH BALANCED I/Q TRANSFORMER

(75) Inventors: Li-Chung Chang, Irvine, CA (US);
Maulin P. Bhagat, San Diego, CA (US);
Hanil Lee, San Diego, CA (US); Ravi Sridhara, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 127 days.

(21) Appl. No.: 12/467,111

(22) Filed: May 15, 2009

(65) Prior Publication Data
US 2011/0110463 A1   May 12, 2011

(51) Int. Cl.
*H04B 3/00* (2006.01)
*H04L 27/00* (2006.01)
(52) U.S. Cl. ........................ 375/258; 375/316
(58) Field of Classification Search .............. 375/222, 375/257–258, 285, 316, 322, 346, 377
See application file for complete search history.

(56) References Cited

U.S. PATENT DOCUMENTS

| | | | |
|---|---|---|---|
| 3,906,382 A | 9/1975 | Miyamoto et al. | |
| 6,654,595 B1 | 11/2003 | Dexter | |
| 7,526,256 B2 * | 4/2009 | Bhatti et al. | 455/73 |
| 8,000,664 B2 * | 8/2011 | Khorram | 455/127.3 |
| 2002/0009131 A1 * | 1/2002 | Chianale et al. | 375/222 |
| 2004/0214547 A1 | 10/2004 | Kim et al. | |
| 2008/0013635 A1 * | 1/2008 | Dupuis | 375/258 |
| 2008/0080624 A1 * | 4/2008 | Feldtkeller | 375/244 |
| 2008/0158081 A1 | 7/2008 | Rofougaran et al. | |
| 2009/0154597 A1 * | 6/2009 | Pan | 375/303 |
| 2010/0158084 A1 * | 6/2010 | Voinigescu et al. | 375/219 |

OTHER PUBLICATIONS

International Search Report and Written Opinion—PCT/US2010/035079, International Search Authority—European Patent Office—Aug. 6, 2010.

* cited by examiner

*Primary Examiner* — Khanh C Tran
(74) *Attorney, Agent, or Firm* — Ramin Mobarhan

(57) ABSTRACT

A receiver with a balanced I/Q transformer is described. In an exemplary design, the receiver includes an LNA that amplifies a received RF signal and provides a single-ended RF signal to the balanced I/Q transformer. The balanced I/Q transformer includes at least one primary coil and first and second secondary coils. The first secondary coil is magnetically coupled to the at least one primary coil and provides a first differential RF signal to a first mixer. The second secondary coil is magnetically coupled to the at least one primary coil and provides a second differential RF signal to a second mixer. The first and second mixers downconvert the first and second differential RF signals with I and Q LO signals, respectively, and provide differential I and Q downconverted signals. The primary and secondary coils may be fabricated on two conductive layers of an integrated circuit.

26 Claims, 7 Drawing Sheets

– 1 –

RECEIVER WITH BALANCED I/Q TRANSFORMER

BACKGROUND

I. Field

The present disclosure relates generally to electronics, and more specifically to a receiver for wireless communication.

II. Background

Receivers are widely used in various wireless communication systems to condition (e.g., amplify, filter, and downconvert) a received radio frequency (RF) signal and provide baseband signals. Receivers are typically required to meet various linearity and noise requirements, which may be stringent for some wireless communication systems. A receiver may be designed with circuits that can meet the linearity and noise requirements. However, these circuits may increase the size and cost of the receiver and may also consume power, all of which are undesirable. A receiver that can minimize these shortcomings, to the extent possible, while providing good performance is highly desirable.

DETAILED DESCRIPTION

The word "exemplary" is used herein to mean "serving as an example, instance, or illustration." Any design described herein as "exemplary" is not necessarily to be construed as preferred or advantageous over other designs.

A receiver with a balanced I/Q transformer is described herein. The receiver may be used for various wireless and wireline communication systems. For example, the receiver may be used for Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, wireless local area networks (WLANs), broadcast systems, satellite positioning systems, etc.

Figure 1:
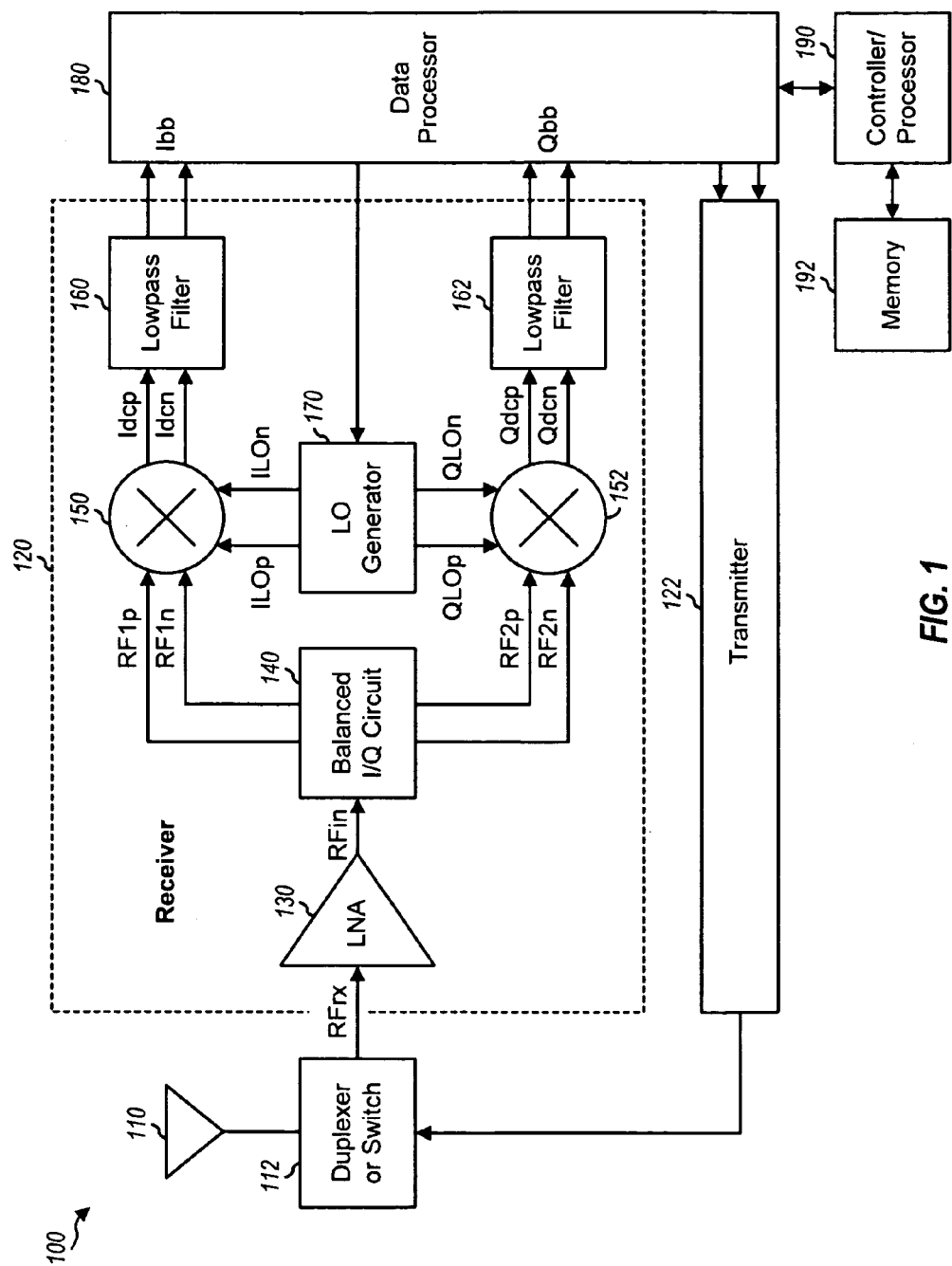
FIG. 1 shows a block diagram of a wireless communication device.

FIG. 1 shows a block diagram of an exemplary design of a wireless communication device 100, which includes a receiver 120 and a transmitter 122. In general, wireless device 100 may include any number of transmitters and any number of receivers for any number of communication systems and any number of frequency bands.

A transmitter or a receiver may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 1, receiver 120 is implemented with the direct-conversion architecture.

In the receive path, an antenna 110 receives downlink signals from base stations, satellites, and/or other transmitter stations and provides an antenna output signal to a duplexer or switch 112. Duplexer/switch 112 may be (i) a duplexer that filters the antenna output signal and provides a received RF signal, RFrx, to receiver 120 or (ii) a switch that passes the antenna output signal as the received RF signal. Within receiver 120, an LNA 130 amplifies the received RF signal and provides a single-ended input RF signal, RFin, to a balanced I/Q circuit 140. Balanced I/Q circuit 140 performs single-ended to differential conversion for the single-ended input RF signal. Balanced I/Q circuit 140 further performs signal splitting, provides a first differential RF signal to an inphase (I) mixer 150, and provides a second differential RF signal to a quadrature (Q) mixer 152. The first differential RF signal comprises an RF1p signal and an RF1n signal. The second differential RF signal comprises an RF2p signal and an RF2n signal.

Mixer 150 downconverts the first differential RF signal with a differential I local oscillator (LO) signal from an LO generator 170 and provides a differential I downconverted signal. A lowpass filter 160 filters the differential I downconverted signal and provides a differential I baseband signal to a data processor 180. Similarly, mixer 152 downconverts the second differential RF signal with a differential Q LO signal from LO generator 170 and provides a differential Q downconverted signal. A lowpass filter 162 filters the differential Q downconverted signal and provides a differential Q baseband signal to data processor 180.

LO generator 170 generates the differential I LO signal for mixer 150 and the differential Q LO signal for mixer 152. The differential I LO signal comprises an ILOp signal and an ILOn signal. The differential Q LO signal comprises a QLOp signal and a QLOn signal. LO generator 170 may include one or more voltage controlled oscillators (VCOs), phase locked loops (PLLs), reference oscillators, dividers, buffers, etc.

FIG. 1 shows an exemplary design of receiver 120. In general, the conditioning of the signals in a receiver may be performed by one or more amplifiers, filters, mixers, etc. These circuits may be arranged differently from the configuration shown in FIG. 1. Furthermore, other circuits not shown in FIG. 1 may be used to condition the signals in the receiver. All or a portion of the receiver may be implemented on one or more RF integrated circuits (RFICs), analog ICs, mixed-signal ICs, etc. For example, LNA 130, balanced I/Q circuit 140, and mixers 150 and 152 may be implemented on an RFIC.

In the transmit path, data processor 180 processes data to be transmitted and provides analog I and Q signals to transmitter 122. Transmitters 122 conditions (e.g., amplifies, filters, and upconverts) the analog I and Q signals and provides a transmit RF signal, which is routed through duplexer/switch 112 and transmitted via antenna 110.

Data processor 180 may include various processing units for data transmission and reception as well as other functions. For example, data processor 180 may include one or more analog-to-digital converters (ADCs), digital-to-analog converters (DACs), digital signal processors (DSPs), reduced instruction set computer (RISC) processors, central processing units (CPUs), etc. A controller/processor 190 may control the operation at wireless device 100. Memory 192 may store program codes and data for wireless device 100. Data processor 180, controller/processor 190, and/or memory 192 may be implemented on one or more application specific integrated circuits (ASICs) and/or other ICs.

In the exemplary design shown in FIG. 1, a single-ended LNA 130 is used to amplify the received RF signal. Single-ended LNA 130 may have lower power consumption, may occupy less die area, and may require fewer external matching components than a differential LNA, all of which may be highly desirable. Differential I and Q mixers 150 and 152 are used in receiver 120, as is normally the case, in order to obtain good performance. A pair of balanced differential RF signals should be provided to I and Q mixers 150 and 152 in order to meet stringent system requirements for residual sideband (RSB), second-order input intercept point (IIP2), etc. In the exemplary design shown in FIG. 1, balanced I/Q circuit 140 provides an interface between single ended LNA 130 and differential I and Q mixers 150 and 152.

Figure 2:
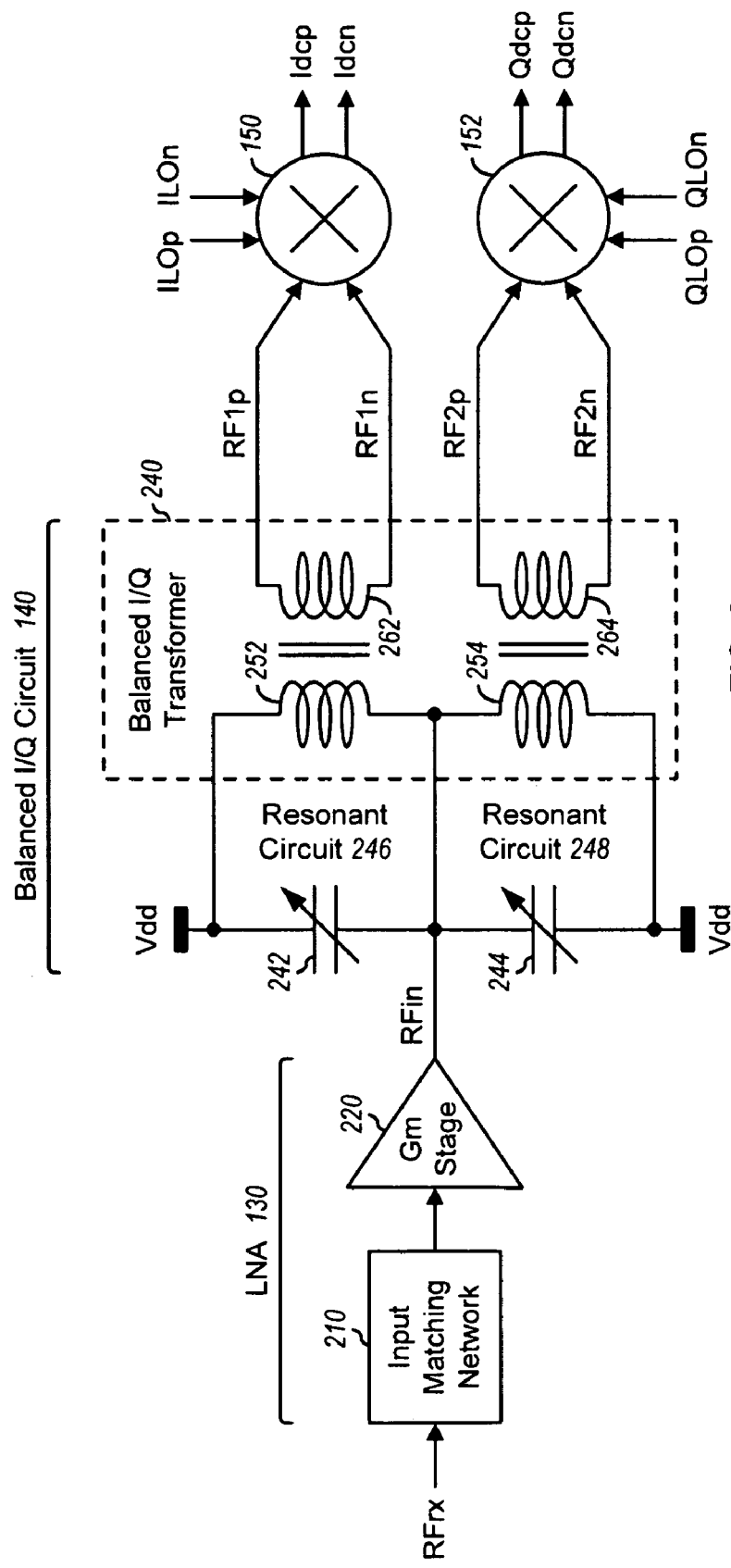
FIG. 2 shows a schematic diagram of a low noise amplifier (LNA) and a balanced inphase/quadrature (I/Q) circuit.

FIG. 2 shows a schematic diagram of an exemplary design of single-ended LNA 130 and balanced I/Q circuit 140 in FIG. 1. In the exemplary design shown in FIG. 2, LNA 130 includes an input matching network 210 and a transconductance (Gm) stage 220. Matching network 210 provides input impedance matching for LNA 130. Gm stage 220 provides amplification for LNA 130 and outputs the single-ended input RF signal, RFin, which is a current signal. Balanced I/Q circuit 140 functions as a passive load for Gm stage 220 and receives the single-ended input RF signal from Gm stage 220. In the exemplary design shown in FIG. 2, balanced I/Q circuit 140 includes a balanced I/Q transformer 240 and variable capacitors (varactors) 242 and 244.

In the exemplary design shown in FIG. 2, balanced I/Q transformer 240 includes two primary coils 252 and 254 and two secondary coils 262 and 264. A coil may also be referred to as an inductor coil, a winding, a conductor, etc. First primary coil 252 and second primary coil 254 are connected at a center tap, which is further connected to the output of LNA 130. First primary coil 252 is coupled between the output of LNA 130 and a power supply voltage, Vdd. Second primary coil 254 is also coupled between the output of LNA 130 and the Vdd supply. The differential ports of primary coils 252 and 254 are thus connected to AC ground. First primary coil 252 is magnetically coupled to first secondary coil 262. Second primary coil 254 is magnetically coupled to second secondary coil 264. Varactor 242 is coupled in parallel with first primary coil 252, and the combination form a first resonant circuit 246. Varactor 244 is coupled in parallel with second primary coil 254, and the combination form a second resonant circuit 248.

As shown in FIG. 2, balanced I/Q transformer 240 comprises a primary side having two primary coils 252 and 254 and a secondary side having two secondary coils 262 and 264. The single-ended input RF signal from LNA 130 is provided to the center tap of primary coils 252 and 254. Secondary coil 262 provides the first differential RF signal, which comprises RF1p and RF1n current signals, to I mixer 150. Secondary coil 264 provides the second differential RF signal, which comprises RF2p and RF2n current signals, to Q mixer 152.

Balanced I/Q circuit 140 has a balanced structure. This enables the first differential RF signal from secondary coil 262 and the second differential RF signal from secondary coil 264 to observe similar loading. In particular, secondary coil 262 observes the impedance of primary coil 252 and varactor 242 coupled between the output of LNA 130 and Vdd. Similarly, secondary coil 264 observes the impedance of primary coil 254 and varactor 244 coupled between the output of LNA 130 and Vdd. Balanced coupling may thus be established to the two secondary coils 262 and 264.

Figure 3:
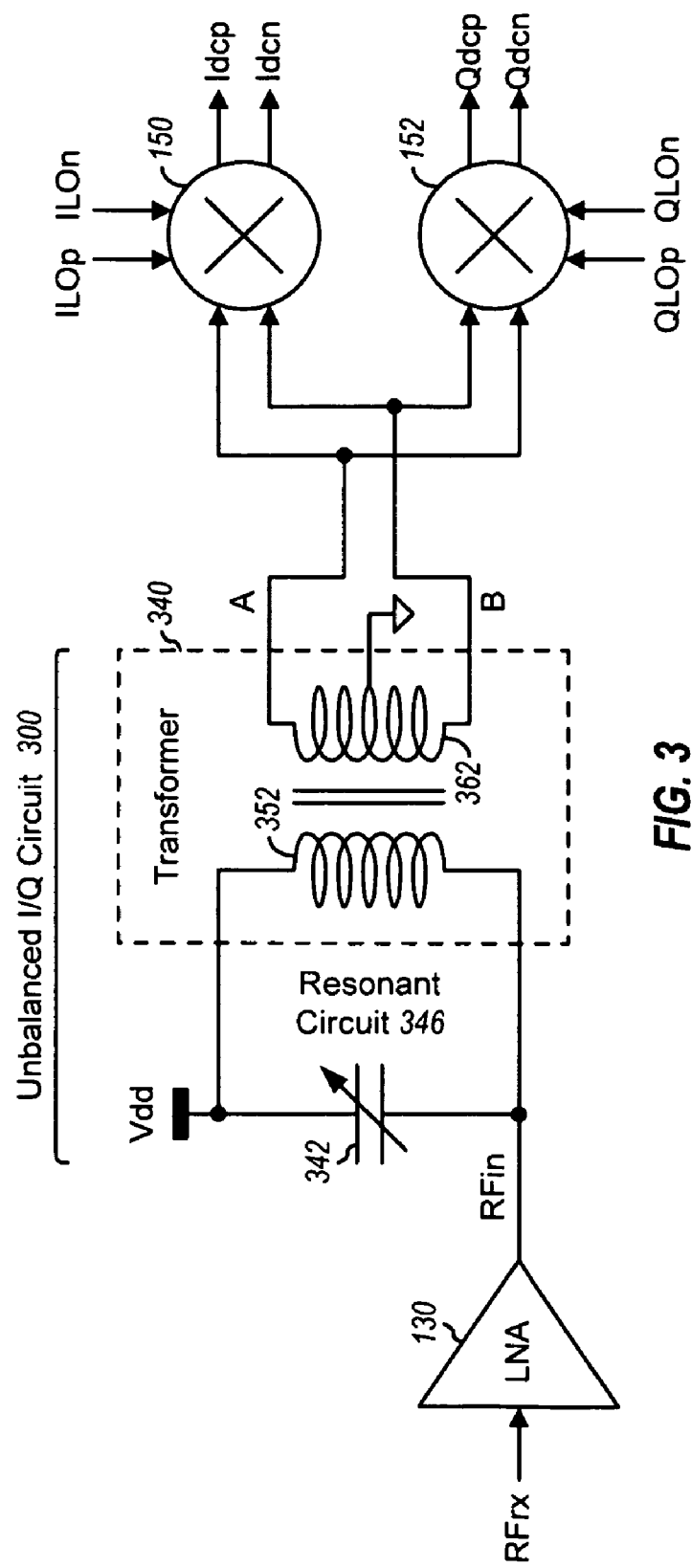
FIG. 3 shows a schematic diagram of an unbalanced I/Q circuit.

FIG. 3 shows a schematic diagram of an exemplary design of an unbalanced I/Q circuit 300 for comparison against balanced I/Q circuit 140 in FIG. 2. Unbalanced I/Q circuit 300 includes a transformer 340 and a varactor 342. Transformer 340 includes a primary coil 352 and a secondary coil 362. Primary coil 352 is coupled between the output of LNA 130 and the Vdd supply and is magnetically coupled to secondary coil 362. Secondary coil 362 has a center tap coupled to circuit ground, and the two ends of secondary coil 362 provide a differential current signal to both I mixer 150 and Q mixer 152. Varactor 342 is coupled in parallel with primary coil 352, and the combination form a resonant circuit 346.

Unbalanced I/Q circuit 300 has a unbalanced structure. In particular, the differential RF signal between node A and the center tap of secondary coil 362 observes coupling between the center tap of primary coil 352 and the Vdd supply. However, the differential RF signal between node B and the center tap of secondary coil 362 observes coupling between the center tap of primary coil 352 and the output of LNA 130. Unbalanced coupling may thus be established at nodes A and B of secondary coil 362.

Balanced I/Q transformer 240 in FIG. 2 may have better performance than unbalanced transformer 340 in FIG. 3 in several aspects. First, the amplitude and phase of the first differential RF signal from secondary coil 262 in balanced I/Q transformer 240 may better match the amplitude and phase of the second differential RF signal from secondary coil 264 due to the balanced structure. Second, better isolation between the I and Q branches may be achieved due to the balanced structure. The I branch refers to the signal path from secondary coil 262 to lowpass filter 160 in FIG. 1, and the Q branch refers to the signal path from secondary coil 264 to lowpass filter 162. Balanced I/Q transformer 240 may thus provide good performance for RSB, IIP2 and possibly other performance metrics. Furthermore, balanced I/Q transformer 240 is entirely passive and consumes no power, which may be desirable for portable devices.

Figure 4:
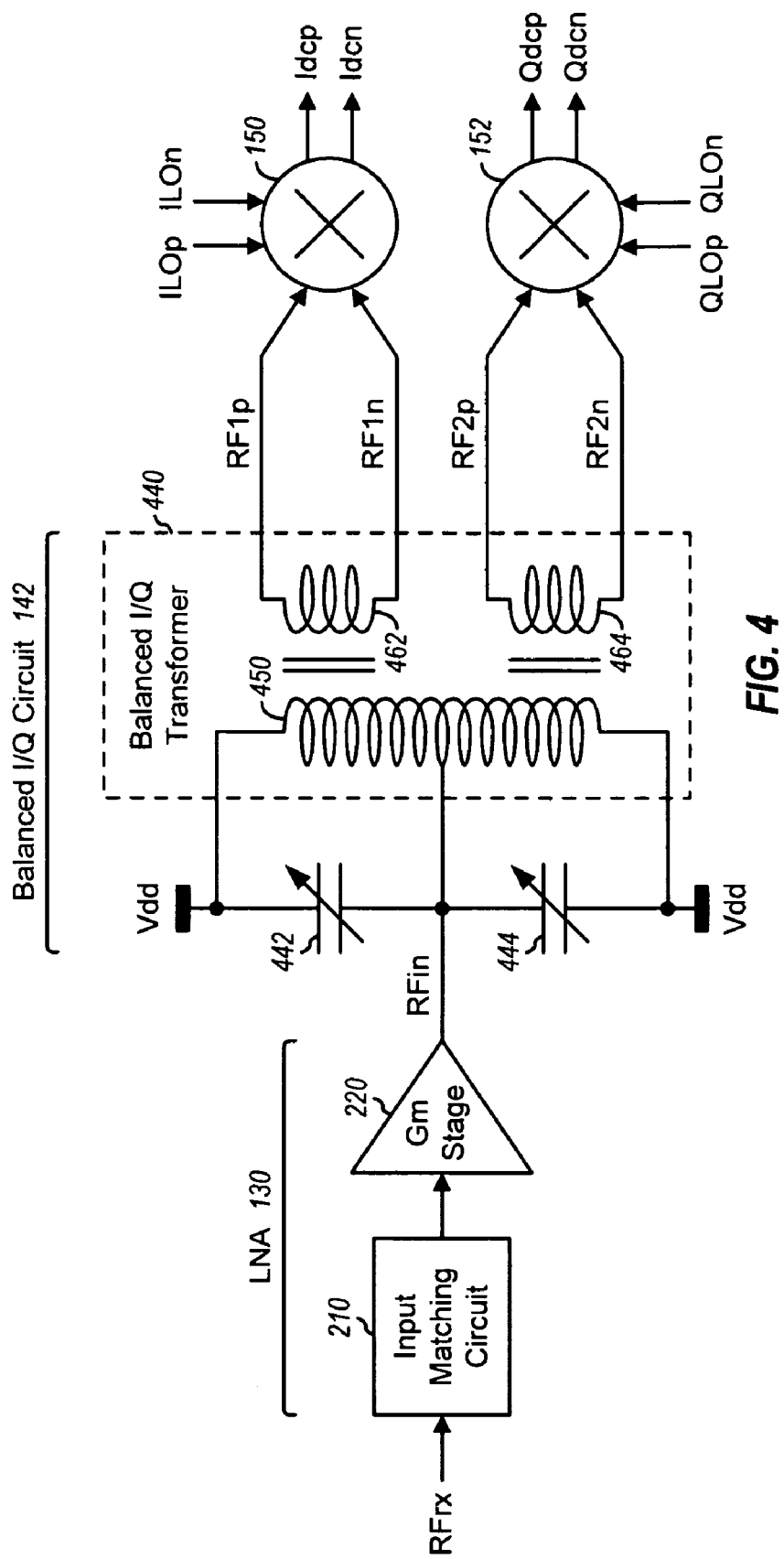
FIG. 4 shows a schematic diagram of another balanced I/Q circuit.

FIG. 4 shows a schematic diagram of an exemplary design of a balanced I/Q circuit 142, which may be used for balanced I/Q circuit 140 in FIG. 1. In this exemplary design, balanced I/Q circuit 142 includes a balanced I/Q transformer 440 and varactors 442 and 444. Balanced I/Q transformer 440 includes a single primary coil 450 and two secondary coils 462 and 464. Primary coil 450 has two ends coupled to the Vdd supply and a center tap that may be connected to the output of LNA 130. First secondary coil 462 is magnetically coupled to a first half of primary coil 450, and second secondary coil 464 is magnetically coupled to a second half of primary coil 450. Varactor 442 is coupled in parallel with the first half of primary coil 450, and varactor 444 is coupled in parallel with the second half of primary coil 450.

In general, the primary side of a balanced I/Q transformer may include one or more primary coils. Each secondary coil may be magnetically coupled to a respective primary coil (e.g., as shown in FIG. 2) or a respective portion of a primary coil (e.g., as shown in FIG. 4).

Figure 5:
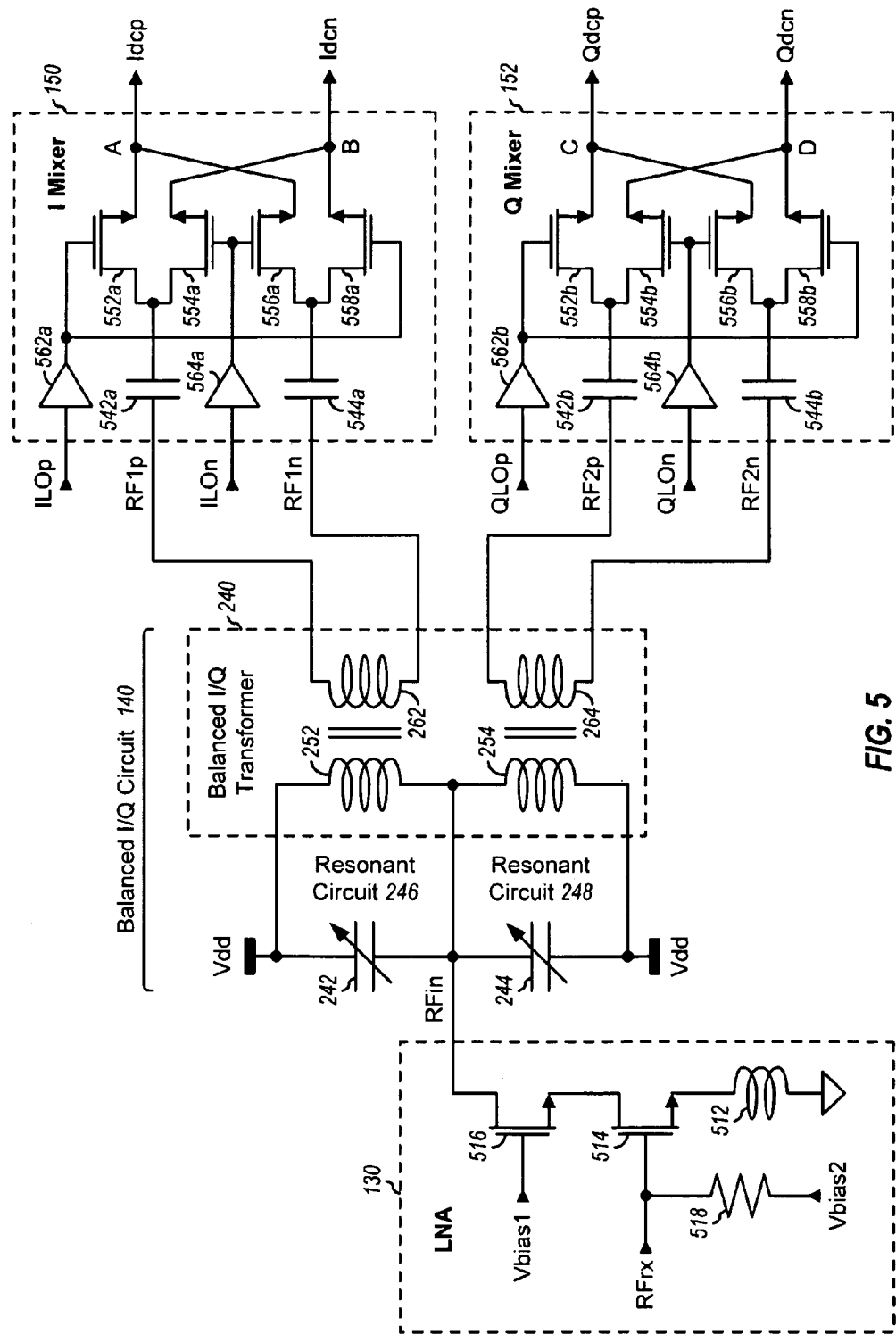
FIG. 5 shows a schematic diagram of the LNA, balanced I/Q circuit, and mixers.

FIG. 5 shows a schematic diagram of an exemplary design of LNA 130, balanced I/Q circuit 140, and mixers 150 and 152 in FIG. 1. In this exemplary design, LNA 130 includes N-channel metal oxide semiconductor (NMOS) transistors 514 and 516. NMOS transistor 514 has its gate receiving the received RF signal, RFrx, its source coupled to one end of an inductor 512, and its drain coupled to the source of NMOS transistor 516. NMOS transistor 516 has its gate receiving a first bias voltage, Vbias1, and its drain providing the single-ended input RF signal, RFin. The other end of inductor 512 is coupled to circuit ground. A resistor 518 has one end coupled to the gate of NMOS transistor 514 and the other end receiving a second bias voltage, Vbias2.

NMOS transistor 514 is a gain transistor that provides amplification for the received RF signal. NMOS transistor 516 is a cascode transistor that provides buffering for the gain transistor and further provides signal drive for the single-ended input RF signal. Inductor 512 is a source degeneration inductor used for a narrowband design of LNA 130. Balanced I/Q circuit 140 acts as a passive load for LNA 130. Varactors 242 and 244 may be tuned to achieve the desired performance. In one exemplary design, varactors 242 and 244 may be tuned such that the resonance frequencies of resonators 246 and 248 are at a desired operating frequency, e.g., the frequency of a channel being received. In another exemplary design, varactors 242 and 244 may be tuned to obtain the desired gain for LNA 130. In general, varactors 242 and 244 may be tuned to vary the loading of LNA 130, which may in turn change the gain and/or other characteristics of LNA 130.

In the exemplary design shown in FIG. 5, I mixer 150 includes two pairs of NMOS transistors cross-coupled together. NMOS transistors 552a and 554a have their drains coupled together, their gates coupled to the outputs of buffers 562a and 564a, respectively, and their sources coupled to nodes A and B, respectively. NMOS transistors 556a and 558a have their drains coupled together, their gates coupled to the outputs of buffers 564a and 562a, respectively, and their sources coupled to nodes A and B, respectively. An AC coupling capacitor 542a has one end receiving the RF1p signal from secondary coil 262 and the other end coupled to the drains of NMOS transistors 552a and 554a. An AC coupling capacitor 544a has one end receiving the RF1n signal from secondary coil 262 and the other end coupled to the drains of NMOS transistors 556a and 558a. Buffers 562a and 564a receive the ILOp and ILOn signals, respectively, which form the differential I LO signal from LO generator 170. Nodes A and B provide the Idcp and Idcn signals, respectively, which form the differential I downconverted signal from I mixer 150.

Q mixer 152 similarly includes two pairs of NMOS transistors cross-coupled together. AC coupling capacitors 542b and 544b receive the RF2p and RF2n signals from secondary coil 264. NMOS transistors 552b and 554b have their drains coupled to capacitor 542a and their sources coupled to nodes C and D, respectively. NMOS transistors 556b and 558b have their drains coupled to capacitor 544b and their sources coupled to nodes C and D, respectively. Buffers 562b and 564b receive the QLOp and QLOn signals, respectively, which form the differential Q LO signal from LO generator 170. Buffer 562b has its output coupled to the gates of NMOS transistors 552b and 558b, and buffer 564b has its output coupled to the gates of NMOS transistors 554b and 556b. Nodes C and D provide the Qdcp and Qdcn signals, respectively, which form the differential Q downconverted signal from Q mixer 152.

FIG. 5 shows an exemplary design of LNA 130 and mixers 150 and 152. These circuits may also be implemented with other designs. For example, a matching network may be used for LNA 130 to provide input impedance matching. A Gm stage may be inserted between balanced I/Q circuit 140 and mixers 150 and 152 and may be used to amplify the two differential RF signals from balanced I/Q circuit 140. Mixers 150 and 152 may also be implemented with other mixer topologies known in the art.

A balanced I/Q transformer may be implemented in various manners. The primary and secondary coils of the balanced I/Q transformer may be implemented with various patterns to obtain the desired inductance and coupling. The primary and secondary coils may also be fabricated on one or more conductive layers.

Figure 6:
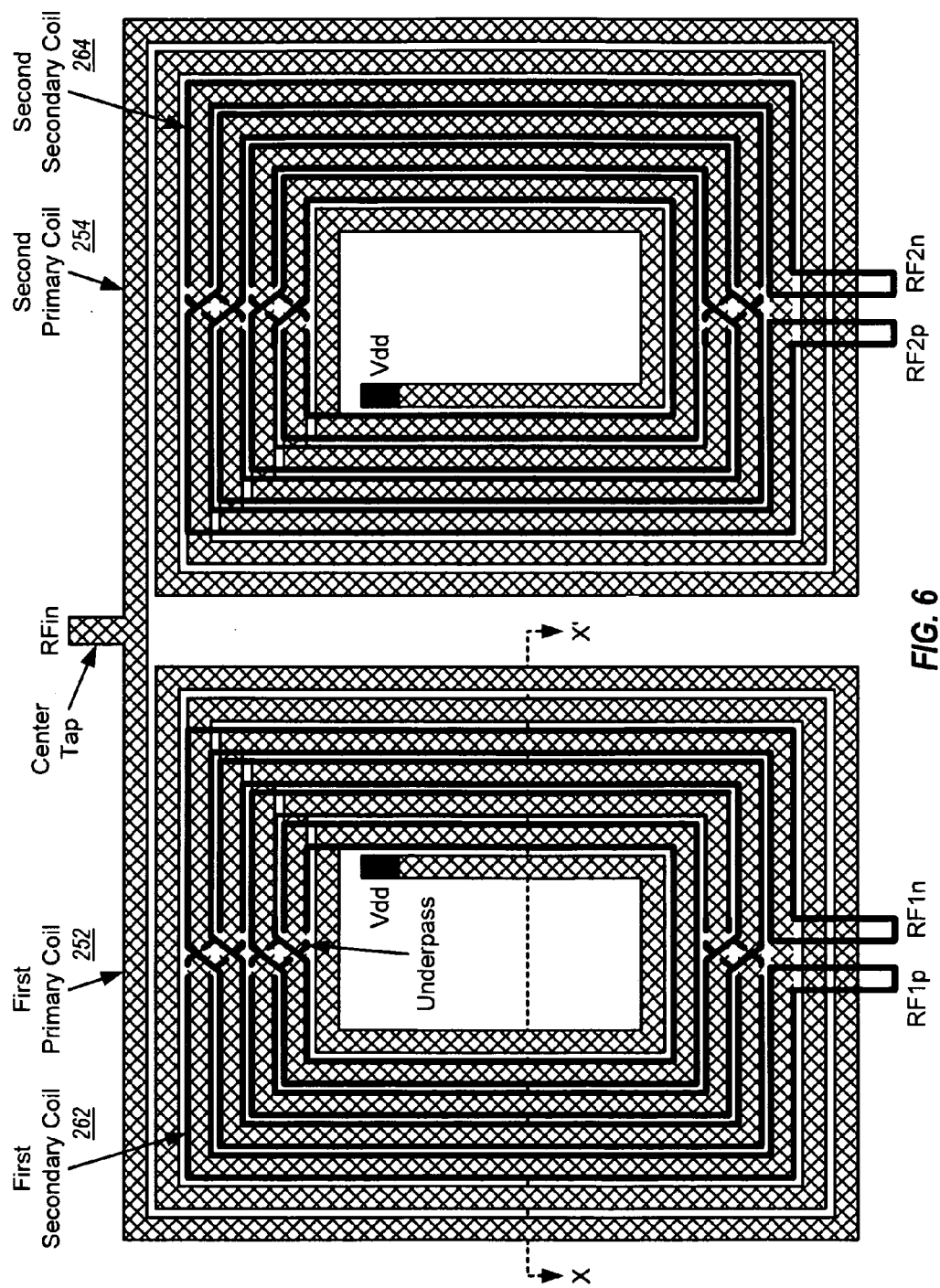
FIG. 6 shows a top view of a balanced I/Q transformer.

FIG. 6 shows a top view of an exemplary design of balanced I/Q transformer 240 in FIG. 2. In this exemplary design, primary coils 252 and 254 are fabricated on a first conductive layer of an RFIC. Secondary coils 262 and 264 are fabricated on a second conductive layer and overlap primary coils 252 and 254, respectively. The first conductive layer may be above the second conductive layer, or vice versa.

Figure 7:
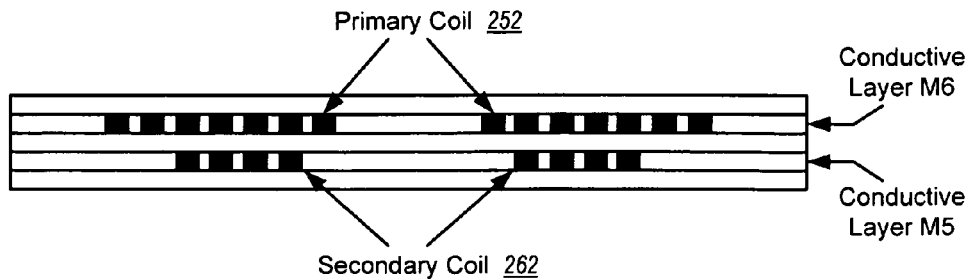
FIG. 7 shows a cross-sectional view of the balanced I/Q transformer in FIG. 6.

FIG. 7 shows a cross-sectional view of balanced I/Q transformer 240 in FIG. 6. The cross-sectional view in FIG. 7 is taken along line X-X' in FIG. 6.

As shown in FIG. 6, first primary coil 252 is implemented with a conductor arranged in a spiral pattern, and second primary coil 254 is implemented with another conductor also arranged in a spiral pattern. Primary coils 252 and 254 are connected at the center tap. Secondary coil 262 is implemented with a conductor arranged in a spiral pattern overlapping the conductor for primary coil 252. Similarly, secondary coil 264 is implemented with a conductor arranged in a spiral pattern overlapping the conductor for primary coil 254. Primary coils 252 and 254 are shown with cross hashing, and secondary coils 262 and 264 are shown with only dark outlines in FIG. 6.

In general, the primary and secondary coils may be fabricated with various conductive materials such as a low-loss metal (e.g., copper), a more lossy metal (e.g., aluminum), or some other material. Higher quality factor (Q) may be achieved for a coil fabricated on a low-loss metal layer. A smaller-size coil may be fabricated on a lossy metal layer because different IC design rules may apply.

In one exemplary design, an RFIC may have six metal layers, which may be referred to as layers M1 through M6. Layer M1 may be the bottommost layer (closest to the substrate), and layer M6 may be the topmost layer. Layers M1 through M4 may be thin copper layers, layer M5 may be a thick copper layer, and layer M6 may be a thick aluminum layer. Primary coils 252 and 254 may be fabricated on the thick aluminum layer M6, as shown in FIG. 7. Secondary coils 262 and 264 may be fabricated on the thick copper layer M5, as shown in FIG. 7. Primary coils 252 and 254 and secondary coils 262 and 264 may thus be fabricated on the two best metal layers (in terms of conductivity) on the RFIC in order to obtain good performance for the balanced I/Q transformer. Sections of the same coil (e.g., secondary coil 262 or 264 in FIG. 6) may be connected through vias and underpasses, which may be formed on metal layer M4 or some other conductive layer.

In the exemplary design shown in FIG. 6, primary coils 252 and 254 are each implemented with seven turns, and secondary coils 262 and 264 are each implemented with four turns. Primary coils 252 and 254 may be implemented with more turns than secondary coils 262 and 264 (e.g., as shown in FIG. 6) to obtain (i) current gain for the differential current signals from secondary coils 262 and 264 and (ii) lower impedance for secondary coils 262 and 264 as compared to primary coils 252 and 254. Primary coils 252 and 254 may also be implemented with (i) the same number of turns as secondary coils 262 and 264 (not shown in FIG. 6) or (ii) fewer turns than secondary coils 262 and 264 (also not shown in FIG. 6) to obtain voltage gain for differential voltage signals from secondary coils 262 and 264.

FIGS. 6 and 7 show an exemplary design in which primary coils 252 and 254 and secondary coils 262 and 264 are stacked and fabricated on two conductive layers. The stacked topology may allow balanced I/Q transformer 240 to be fabricated in a smaller die area and may also result in better matching between the I and Q branches. In another exemplary design, all of the primary and secondary coils may be fabricated on a single conductive layer. Primary coil 252 and secondary coil 262 may be interlaced or interwoven, and primary coil 254 and secondary coil 264 may be interlaced. This side-by-side topology may be used when there is a limited number of metal layers. This side-by-side topology may also provide less capacitance between the primary and secondary coils as compared to the stacked topology. Less capacitance may be desirable in order to achieve a higher self resonance frequency (SRF) of the transformer for high frequency operation. In yet another exemplary design, the primary and secondary coils may be fabricated on three or more conductive layers. For example, a single primary coil may be fabricated on a first conductive layer, a first secondary coil may be fabricated on a second conductive layer above the first conductive layer, and a second secondary coil may be fabricated on a third conductive layer below the first conductive layer.

FIG. 6 shows an exemplary design in which coils 252, 254, 262 and 264 are implemented with spiral patterns. Coils 252 and 262 may be formed in a first direction (e.g., counterclockwise in FIG. 6), and coils 254 and 264 may be formed in a second direction (e.g., clockwise in FIG. 6) opposite of the first direction. Forming secondary coils 262 and 264 in opposite direction of one another may reduce mutual coupling between the two secondary coils, which may improve isolation between the I and Q branches. Each pair of coupled coils may also be implemented in other manners. For example, coils 252 and 262 as well as coils 254 and 264 may be arranged in a double spiral, zig-zag, or some other pattern. In general, different topologies, layout patterns, and fabrication techniques may provide different advantages for the balanced I/Q transformer.

Varactors 242 and 244 for balanced I/Q circuit 140 may be implemented in various manners. In an exemplary design, varactors 242 and 244 may each be implemented with a bank of selectable capacitors. Each selectable capacitor may be selected to increase capacitance or deselected to reduce capacitance. In an exemplary design, the capacitors for varactors 242 and 244 may be implemented with MOS capacitors, which may be fabricated on a layer under secondary coils 262 and 264, respectively. In another exemplary design, varactors 242 and 244 may be implemented with Micro-Electro-Mechanical Systems (MEMS) varactors. A MEMS varactor may have a mechanical membrane that may be moved up or down with a DC voltage to adjust the capacitance of the MEMS varactor. The mechanical membranes for the MEMS varactors may be formed in the center area of primary coils 252 and 254 in FIG. 6.

In an exemplary design, balanced I/Q transformer 240 may be fabricated on an RFIC that includes LNA 130 and mixers 150 and 152. This may reduce cost and size. The RFIC may also include other circuits, e.g., the circuits in receiver 120 in FIG. 1.

In general, an apparatus may comprise first, second and third circuits and a transformer. The first circuit may provide a single-ended signal. The transformer may be coupled to the first circuit and may comprise at least one primary coil and first and second secondary coils. The at least one primary coil may receive the single-ended signal from the first circuit. The first secondary coil may be magnetically coupled to the at least one primary coil (e.g., magnetically coupled to a respective primary coil as shown in FIG. 2 or to a respective section of a primary coil as shown in FIG. 4) and may provide a first differential signal to the second circuit. The second secondary coil may be magnetically coupled to the at least one primary coil and may provide a second differential signal to the third circuit.

In one exemplary design, the first circuit may comprise an LNA that amplifies a received RF signal and provides the single-ended signal to the transformer. The at least one primary coil may operate as a passive load for the LNA, e.g., as shown in FIGS. 2 and 5. The second circuit may comprise a first mixer that downconverts the first differential signal with an I LO signal and provides a differential I downconverted signal, e.g., as shown in FIG. 5. The third circuit may comprise a second mixer that downconverts the second differential signal with a Q LO signal and provides a differential Q downconverted signal.

In one exemplary design, the at least one primary coil may comprise first and second primary coils, e.g., as shown in FIG. 2. The first primary coil may be magnetically coupled to the first secondary coil and may receive the single-ended signal. The second primary coil may be magnetically coupled to the second secondary coil and may also receive the single-ended signal. In another exemplary design, the at least one primary coil may comprise a single primary coil having a center tap receiving the single-ended signal, e.g., as shown in FIG. 4. The first secondary coil may be magnetically coupled to the first half of the primary coil. The second secondary coil may be magnetically coupled to the second half of the primary coil.

In one exemplary design, the primary coil(s) may be fabricated on a first conductive layer, and the secondary coils may be fabricated on a second conductive layer. In another exemplary design, the primary and second secondary coils may be fabricated on a single conductive layer.

In the exemplary design shown in FIG. 2, the first and second primary coils may each comprise a first number of turns. The first and second secondary coils may each comprise a second number of turns, which may be fewer than the first number of turns. The first secondary coil may overlay (e.g., either on top of or underneath) the first primary coil, e.g., as shown in FIGS. 6 and 7. The second secondary coil may overlay the second primary coil. The first primary coil and the first secondary coil may be formed with spiral patterns in a first direction. The second primary coil and the second secondary coil may be formed with spiral patterns in a second direction, which may be opposite of the first direction, as shown in FIG. 6. The primary and secondary coils may also be fabricated in other manners.

In an exemplary design, a first varactor may be coupled in parallel with the first primary coil and may form a first resonant circuit. The second varactor may be coupled in parallel with the second primary coil and may form a second resonant circuit. In an exemplary design, the varactors may be fabricated under the transformer on an integrated circuit. The varactors may also be implemented with MEMS varactors and/or fabricated in other manners.

In an exemplary design, an integrated circuit (e.g., an RFIC) may comprise an LNA and a transformer. The LNA may amplify a received RF signal and provide a single-ended RF signal. The transformer may be coupled to the LNA and may comprise at least one primary coil and first and second secondary coils. The at least one primary coil may receive the single-ended RF signal from the LNA and may operate as a load for the LNA. The first secondary coil may be magnetically coupled to the at least one primary coil and may provide a first differential RF signal. The second secondary coil may be magnetically coupled to the at least one primary coil and may provide a second differential RF signal. In one exemplary design, the at least one primary coil may comprise (i) a first primary coil magnetically coupled to the first secondary coil and (ii) a second primary coil magnetically coupled to the second secondary coil, e.g., as shown in FIG. 2.

In one exemplary design, the LNA may comprise first and second transistors. The first transistor (e.g., NMOS transistor 514 in FIG. 5) may provide amplification for the received RF signal. The second transistor (e.g., NMOS transistor 516) may be coupled to the first transistor and may provide the single-ended RF signal to the transformer.

The integrated circuit may further comprise first and second mixers. The first mixer may downconvert the first differential RF signal with an I LO signal and may provide a differential I downconverted signal. The second mixer may downconvert the second differential RF signal with a Q LO signal and may provide a differential Q downconverted signal. In one exemplary design, each mixer may comprise two pairs of transistors, e.g., as shown in FIG. 5. The first pair of transistors may downconvert a non-inverting RF signal with a differential LO signal. The second pair of transistors may downconvert an inverting RF signal with the differential LO signal. The non-inverting and inverting RF signals may be for the first or second differential RF signal from the transformer.

In another exemplary design, a wireless communication device may comprise an antenna, an LNA, and a transformer. The antenna may provide a received RF signal. The LNA may amplify the received RF signal and provide a single-ended RF signal. The transmitter may be coupled to the LNA and may comprise at least one primary coil and first and second secondary coils, which may be coupled as shown in FIG. 2 or 4. The wireless device may further comprise first and second mixers. The first mixer may downconvert a first differential RF signal from the first secondary coil with an I LO signal and provide a differential I downconverted signal. The second mixer may downconvert a second differential RF signal from the second secondary coil with a Q LO signal and provide a differential Q downconverted signal.

Figure 8:
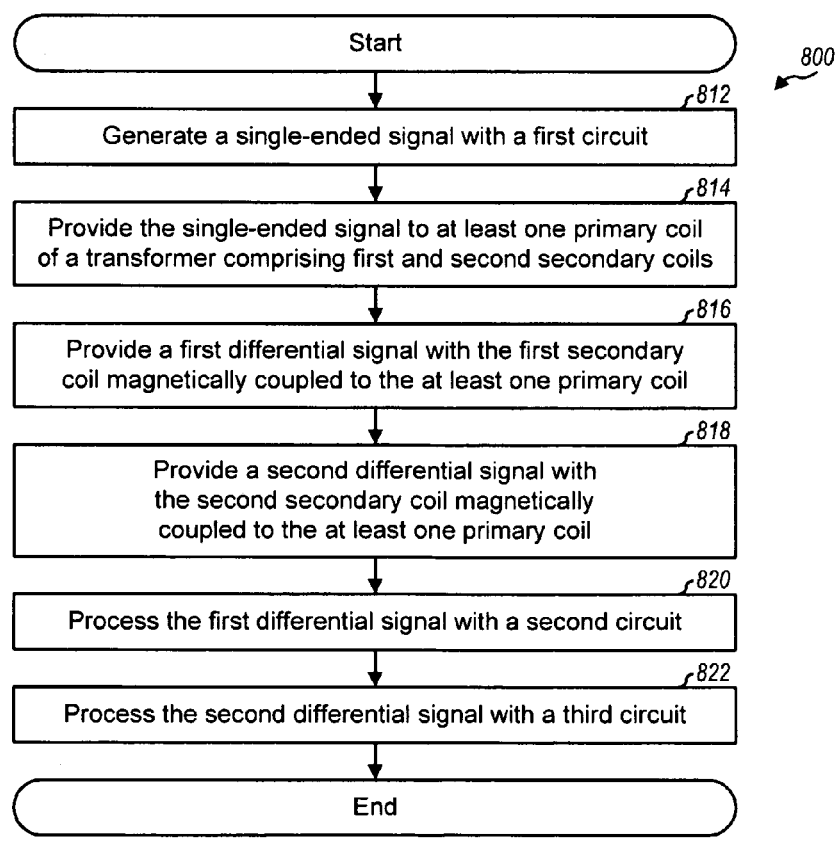
FIG. 8 shows a process of processing a signal.

FIG. 8 shows an exemplary design of a process 800 for processing a signal. A single-ended signal may be generated with a first circuit (block 812) and provided to at least one primary coil of a transformer comprising first and second secondary coils (block 814). In an exemplary design of block 812, a received RF signal may be amplified with an LNA to generate the single-ended signal.

A first differential signal may be provided with the first secondary coil magnetically coupled to the at least one primary coil (block 816). A second differential signal may be provided with the second secondary coil magnetically coupled to the at least one primary coil (block 818). The first differential signal may be processed with a second circuit, e.g., downconverted with a first mixer to obtain a differential I downconverted signal (block 820). The second differential signal may be processed with a third circuit, e.g., downconverted with a second mixer to obtain a differential Q downconverted signal (block 822).

The balanced I/Q transformer described herein may be used in a receiver, as described above. The balanced I/Q transformer may also be used in a transmitter and other electronics circuits.

A receiver with a balanced I/Q transformer described herein may be implemented on an IC, an analog IC, an RFIC, a mixed-signal IC, an ASIC, a printed circuit board (PCB), an electronics device, etc. The receiver with balanced I/Q transformer may also be fabricated with various IC process technologies such as complementary metal oxide semiconductor (CMOS), NMOS, P-channel MOS (PMOS), bipolar junction transistor (BJT), bipolar-CMOS (BiCMOS), silicon germanium (SiGe), gallium arsenide (GaAs), etc.

An apparatus implementing the receiver with balanced I/Q transformer described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first circuit providing a single-ended signal; and
   a transformer coupled to the first circuit and comprising
      at least one primary coil receiving the single-ended signal,
      a first secondary coil magnetically coupled to the at least one primary coil and providing a first differential signal to a second circuit, and
      a second secondary coil magnetically coupled to the at least one primary coil and providing a second differential signal to a third circuit.

2. The apparatus of claim 1, the first circuit comprising a low noise amplifier (LNA) amplifying a received radio frequency (RF) signal and providing the single-ended signal to the transformer.

3. The apparatus of claim 2, the at least one primary coil operating as a passive load for the LNA.

4. The apparatus of claim 1, the second circuit comprising a first mixer downconverting the first differential signal with an inphase (I) local oscillator (LO) signal and providing a differential I downconverted signal, and the third circuit comprising a second mixer downconverting the second differential signal with a quadrature (Q) LO signal and providing a differential Q downconverted signal.

5. The apparatus of claim 1, the at least one primary coil comprising
   a first primary coil magnetically coupled to the first secondary coil and receiving the single-ended signal, and
   a second primary coil magnetically coupled to the second secondary coil and receiving the single-ended signal.

6. The apparatus of claim 1, the at least one primary coil comprising a single primary coil having a center tap receiving the single-ended signal, the first secondary coil being magnetically coupled to a first half of the primary coil, and the second secondary coil being magnetically coupled to a second half of the primary coil.

7. The apparatus of claim 1, the at least one primary coil being fabricated on a first conductive layer, and the first and second secondary coils being fabricated on a second conductive layer.

8. The apparatus of claim 1, the at least one primary coil and the first and second secondary coils being fabricated on a single conductive layer.

9. The apparatus of claim 5, the first and second primary coils each comprising a first number of turns, and the first and second secondary coils each comprising a second number of turns fewer than the first number of turns.

10. The apparatus of claim 5, the first secondary coil overlaying the first primary coil, and the second secondary coil overlaying the second primary coil.

11. The apparatus of claim 5, the first primary coil and the first secondary coil being formed with spiral patterns in a first direction, and the second primary coil and the second secondary coil being formed with spiral patterns in a second direction opposite of the first direction.

12. The apparatus of claim 5, further comprising:
    a first varactor coupled in parallel with the first primary coil and forming a first resonant circuit; and
    a second varactor coupled in parallel with the second primary coil and forming a second resonant circuit.

13. The apparatus of claim 12, the first and second varactors being fabricated under the transformer on an integrated circuit.

14. An integrated circuit comprising:
    a low noise amplifier (LNA) amplifying a received radio frequency (RF) signal and providing a single-ended RF signal; and
    a transformer coupled to the LNA and comprising
        at least one primary coil receiving the single-ended RF signal,
        a first secondary coil magnetically coupled to the at least one primary coil and providing a first differential RF signal, and
        a second secondary coil magnetically coupled to the at least one primary coil and providing a second differential RF signal.

15. The integrated circuit of claim 14, further comprising:
    a first mixer downconverting the first differential RF signal with an inphase (I) local oscillator (LO) signal and providing a differential I downconverted signal; and
    a second mixer downconverting the second differential RF signal with a quadrature (Q) LO signal and providing a differential Q downconverted signal.

16. The integrated circuit of claim 14, the at least one primary coil comprising
    a first primary coil magnetically coupled to the first secondary coil and receiving the single-ended RF signal, and
    a second primary coil magnetically coupled to the second secondary coil and receiving the single-ended RF signal.

17. The integrated circuit of claim 14, the LNA comprising
    a first transistor providing amplification for the received RF signal, and
    a second transistor coupled to the first transistor and providing the single-ended RF signal to the transformer.

18. The integrated circuit of claim 14, each of the first and second mixers comprising
    a first pair of transistors downconverting a non-inverting RF signal with a differential local oscillator (LO) signal, and
    a second pair of transistors downconverting an inverting RF signal with the differential LO signal, the non-inverting and inverting RF signals being for the first or second differential RF signal from the transformer.

19. A wireless communication device comprising:
    an antenna providing a received radio frequency (RF) signal;
    a low noise amplifier (LNA) amplifying the received RF signal and providing a single-ended RF signal; and
    a transformer coupled to the LNA and comprising
        at least one primary coil receiving the single-ended RF signal,
        a first secondary coil magnetically coupled to the at least one primary coil and providing a first differential RF signal, and
        a second secondary coil magnetically coupled to the at least one primary coil and providing a second differential RF signal.

20. The wireless communication device of claim 19, further comprising:
    a first mixer downconverting the first differential RF signal with an inphase (I) local oscillator (LO) signal and providing a differential I downconverted signal; and
    a second mixer downconverting the second differential RF signal with a quadrature (Q) LO signal and providing a differential Q downconverted signal.

21. The wireless communication device of claim 19, the at least one primary coil comprising
    a first primary coil magnetically coupled to the first secondary coil and receiving the single-ended RF signal, and
    a second primary coil magnetically coupled to the second secondary coil and receiving the single-ended RF signal.

22. A method comprising:
    generating a single-ended signal with a first circuit;
    providing the single-ended signal to at least one primary coil of a transformer comprising first and second secondary coils;
    providing a first differential signal with the first secondary coil magnetically coupled to the at least one primary coil;
    providing a second differential signal with the second secondary coil magnetically coupled to the at least one primary coil;
    processing the first differential signal with a second circuit; and processing the second differential signal with a third circuit.

23. The method of claim 22, the generating the single-ended signal with the first circuit comprises amplifying a received radio frequency (RF) signal with a low noise amplifier (LNA) to generate the single-ended signal.

24. The method of claim 22,
the processing the first differential signal with the second circuit comprises
downconverting the first differential signal with a first mixer to obtain a differential inphase (I) downconverted signal, and
the processing the second differential signal with the third circuit comprises
downconverting the second differential signal with a second mixer to obtain a differential quadrature (Q) downconverted signal.

25. The method of claim 22, the single-ended signal being provided to first and second primary coils, the first primary coil being magnetically coupled to the first secondary coil, and the second primary coil being magnetically coupled to the second secondary coil.

26. An apparatus comprising:
means for generating a single-ended signal;
means for providing the single-ended signal to at least one primary coil of a transformer comprising first and second secondary coils;
means for providing a first differential signal with the first secondary coil magnetically coupled to the at least one primary coil;
providing a second differential signal with the second secondary coil magnetically coupled to the at least one primary coil;
means for processing the first differential signal; and
means for processing the second differential signal.

* * * * *